United States Patent [19]

Matsuo

[11] Patent Number: 4,982,372
[45] Date of Patent: Jan. 1, 1991

[54] SEMICONDUCTOR MEMORY DEVICE HAVING DIVIDED WORD OR BIT LINE DRIVERS AND OPERATING METHOD THEREFOR

[75] Inventor: Ryuitch Matsuo, Hyogo, Japan

[73] Assignee: Mitsubishi Denki Kabushiki Kaisha, Tokyo, Japan

[21] Appl. No.: 366,707

[22] Filed: Jun. 15, 1989

[30] Foreign Application Priority Data

Jun. 16, 1988 [JP] Japan ................................ 63-148741

[51] Int. Cl.$^5$ ................................................ G11C 8/02
[52] U.S. Cl. .......................... 365/230.03; 365/230.04; 365/230.06; 365/185
[58] Field of Search ...................... 365/230.03, 230.04, 365/230.06, 185

[56] References Cited

U.S. PATENT DOCUMENTS

| | | | |
|---|---|---|---|
| 4,613,958 | 9/1986 | Culican et al. | 365/230.06 |
| 4,783,764 | 11/1988 | Tsuchiya et al. | 365/185 |
| 4,818,900 | 4/1989 | Klass et al. | 365/230.06 |
| 4,875,196 | 10/1989 | Spaderna et al. | 365/230.04 |

FOREIGN PATENT DOCUMENTS 61-283162 12/1986 Japan .

Primary Examiner—Joseph E. Clawson, Jr.
Attorney, Agent, or Firm—Lowe, Price, Leblanc, Becker & Shur

[57] ABSTRACT

A memory array is divided into first and second memory array blocks. Two word line and/or bit line selection decoders are provided on each memory array block. One of two word line and/or bit line selection decoders is provided between two memory array blocks and the other is provided on the opposite side of the one word line selection decoder about the memory array block. A plurality of word lines in the memory array blocks are alternately connected to the one word line selection decoder and the other word line selection decoder.

13 Claims, 10 Drawing Sheets

25: DECODER CIRCUIT    26: DRIVER CIRCUIT    WORD LINE EQUIVALENT CIRCUIT

SEMICONDUCTOR MEMORY DEVICE HAVING DIVIDED WORD OR BIT LINE DRIVERS AND OPERATING METHOD THEREFOR

BACKGROUND OF THE INVENTION

Field of the Invention

The present invention relates to a semiconductor memory device and, more particularly, a semiconductor memory device having divided word or bit line drivers to increase integration density and an operating method therefor.

Description of the Background of the Art

Recently, a semiconductor memory device such as a ROM (Read Only Memory) and a RAM (Random Access Memory) having a high degree of integration and large capacity has been developed rapidly. Although the principles of this invention are applicable to the RAM and the ROM, a description hereinafter shall be made by way of an example of the ROM.

Figure 11:
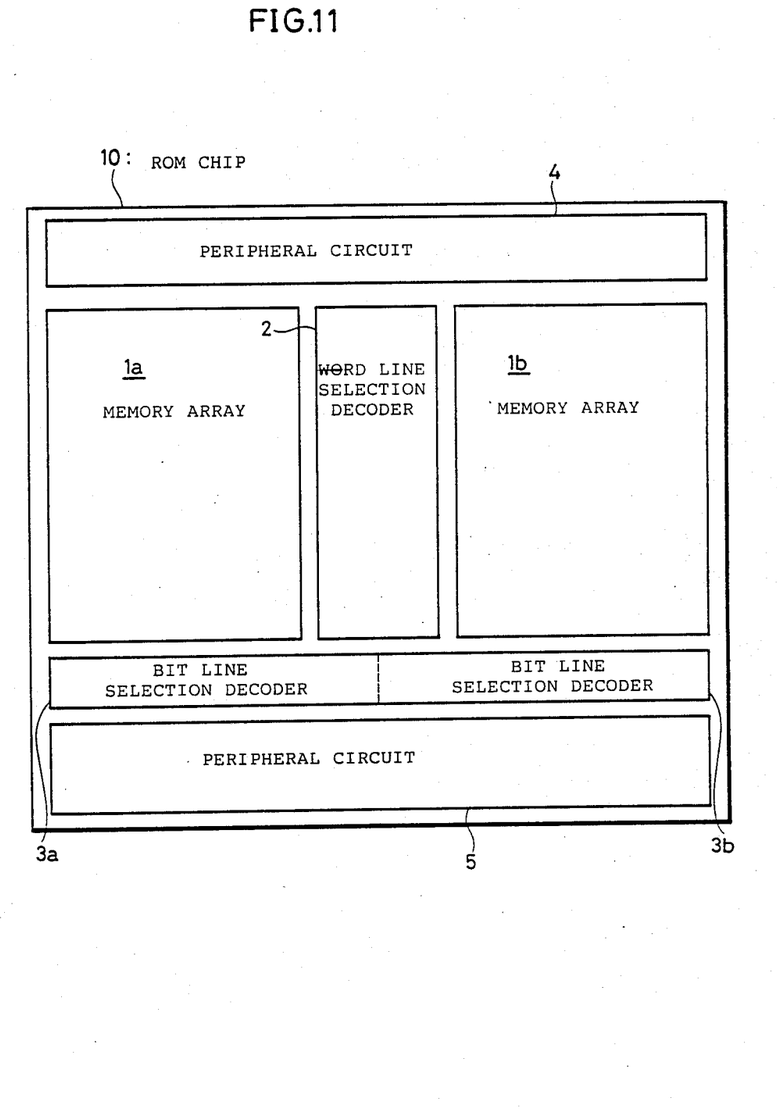
FIG. 11 is a plan block diagram of a conventional ROM chip.

FIG. 11 is a block diagram of a conventional ROM chip in general.

Referring to FIG. 11, a word line selection decoder 2 is arranged in a central portion of an ROM chip 10 and memory arrays 1a and 1b are arranged at both sides of the decoder 2. In addition, bit line selection decoders 3a and 3b are arranged at one side of the memory arrays 1a and 1b and a peripheral circuit 5 comprising a sense amplifier and the like is arranged at the outside of the decoders 3a and 3b. A peripheral circuit 4 comprising an address buffer and the like is arranged at the other side of the memory arrays 1a and 1b.

Figure 12:
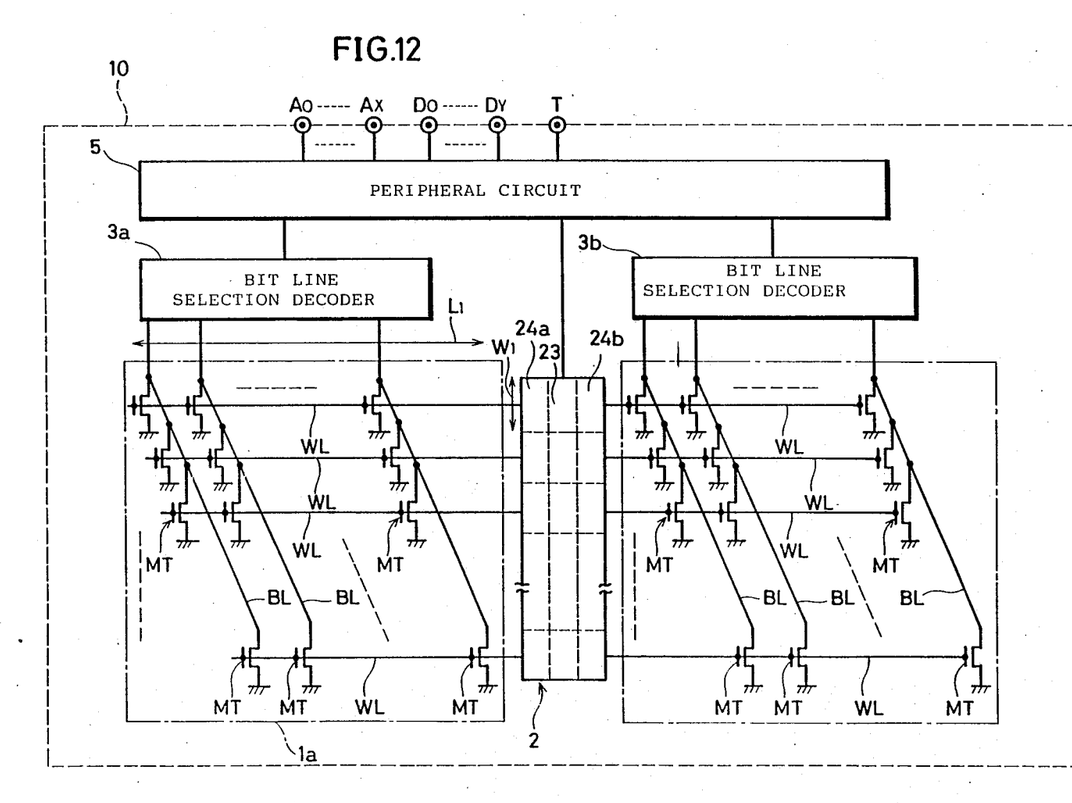
FIG. 12 is a circuit diagram of the main portion of the ROM device in FIG. 11.

FIG. 12 is a circuit diagram of a main portion of the ROM device in FIG. 11.

Referring to FIG. 12, the memory arrays 1a and 1b comprise a plurality of word lines WL and bit lines BL intersecting with each other. A memory cell comprising a memory transistor MT is connected to each intersection of word lines WL and bit lines BL. On the other hand, a word line selection decoder 2 comprises a plurality of decoders 23 and driver circuits 24a and 24b arranged respectively on opposite sides of the circuit 23, corresponding to a plurality of word lines WL in the memory arrays 1a and 1b. Each decoder circuit 23 is connected to the corresponding word line WL in the memory arrays 1a and 1b through the driver circuits 24a and 24b. The plurality of bit lines BL in the memory arrays 1a and 1b are connected to the bit line selection decoders 3a and 3b, respectively. The bit line selection decoders 3a and 3b are connected to a peripheral circuit 5 comprising a sense amplifier and the like.

A threshold voltage $V_{TH}$ of each memory transistor MT is set at, for example 1.0 V or 8.0 V corresponding to the memory information "1" or "0". For example, boron is implanted in a P type substrate by using a mask. In this case, when the quantity of implantation is large, the threshold voltage $V_{TH}$ is high. When the quantity of implantation is small, the threshold voltage $V_{TH}$ is low.

A description is made of reading operation of the ROM device in FIG. 12.

Address signals AO to AX are applied to the word line selection decoder 2 and bit line selection decoders 3a and 3b through the peripheral circuit 5 comprising an address buffer and the like. Data DO to DY and a timing signal T are applied to the peripheral circuit 5. The word line selection decoder 2 selects a word line WL in the memory arrays 1a and 1b in response to the address signals AO to AX. A potential at a logical high, or "H" level is outputted to the word line WL selected by the word line selection decoder 2 and a potential at a logical low, or "L" level is outputted to a nonselected word line WL.

When the potential of the word line WL is at the "H" level, the memory transistor MT turns on or off depending on the threshold voltage $V_{TH}$. More specifically, when the threshold voltage $V_{TH}$ is 1.0 V, the memory transistor MT turns on and when the threshold voltage $V_{TH}$ is 8.0 V, the memory transistor MT turns off. In addition, the memory transistor MT turns off when the potential of the word line WL attains the "L" level.

The bit line selection decoders 3a and 3b select bit lines BL in the memory arrays 1a and 1b in response to the addresses signals AO to AX. The bit lines BL selected by the bit line selection decoder 3a or 3b are connected to the peripheral circuit 5 comprising the sense amplifier and the like. In this way, a drain potential of the selected memory transistor MT is transmitted to the sense amplifier in the peripheral circuit 5 and then "1" or "0" is read from the memory.

In the semiconductor memory device having an increased capacity and degree of integration, the whole area of the memory arrays 1a and 1b can be minimized in general as much as possible by using a very small scaled pattern dimension in the portion of the memory transistor MT. However, as the memory capacity becomes large, the number of memory transistors MT connected to the word lines WL and bit lines BL is increased, with the result that the load capacitance of the word lines WL and the bit lines BL is increased. In addition, as the semiconductor memory device is miniaturized, the pitch between the word lines WL and the pitch between the bit lines BL become small, with the result that the width W1 of the occupied region of the word line selection decoder 2 per word line WL and the width of the occupied regions of the bit line selection decoders 3a and 3b per bit line BL become small. Because the load capacitance of the word line WL and bit line BL is increased, it is necessary to increase driving capability of the word line selection decoder 2 and the bit line selection decoders 3a and 3b. However, it is difficult to constitute the word line selection decoder 2 and the bit line selection decoders 3a and 3b having sufficiently great driving capability since the occupied area of them is small. Consequently, there was a disadvantage that charging and discharging time of load capacitance connected to the word line WL and the bit line BL became long, whereby the operation speed of the whole semiconductor memory device became slow.

Figure 13:
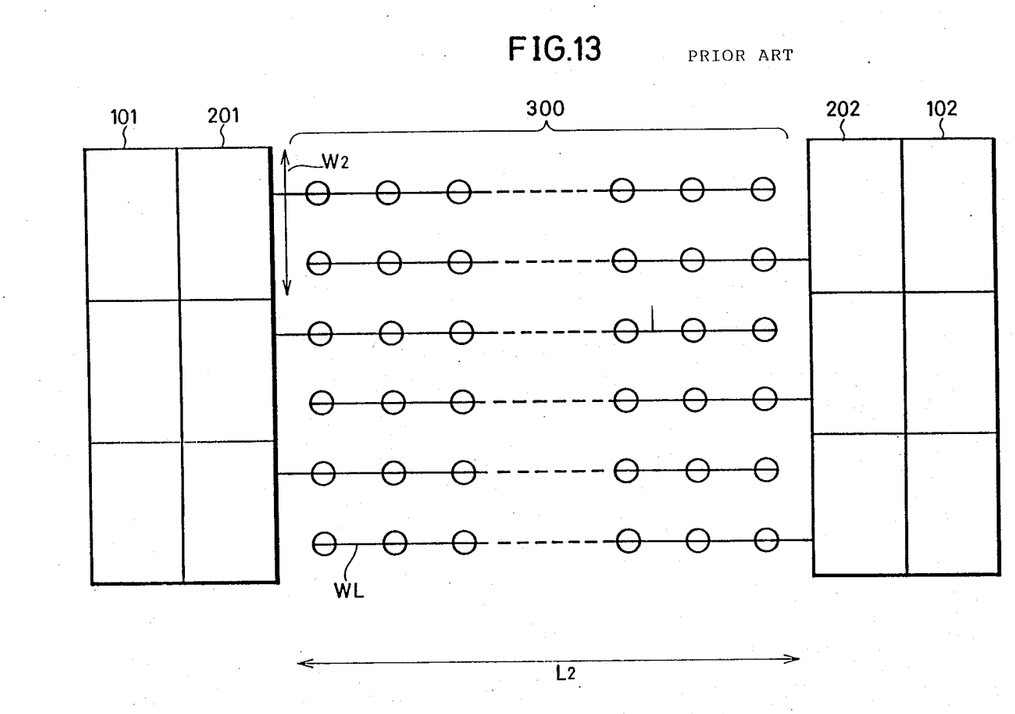
FIG. 13 is a block diagram showing another conventional semiconductor memory device.

In order to increase the occupied area of the word line selection decoder, one semiconductor memory device is disclosed in Japanese Patent Laying-Open No. 283162/1986, as shown in FIG. 13. In the semiconductor device, columns of first and second word line driver circuits 201 and 202 are arranged respectively at opposite sides of a memory matrix 300 and word line decoder circuits 101 and 102 are arranged attached thereto, respectively. A plurality of word lines in the memory matrix 300 are alternately connected to first word line driver circuits 201 and second word line driver circuits 202. As a result, each word line driver circuit 201 and 202 can be formed in a region W2 twice as large as the word line pitch.

However, in such a semiconductor memory device, since the word line driver circuits and the word line decoder circuits are provided respectively at opposite sides of the memory matrix, the length L2 of each word line becomes twice as long as the length L1 of the conventional word line shown in FIGS. 11 and 12, so that the number of memory cells connected to a word line becomes twice as much. As a result, there was a disadvantage that the load capacitance of each word line was increased.

SUMMARY OF THE INVENTION

An object of the present invention is to speed up the operation of a semiconductor memory device having an increased degree of integration and large capacity.

Another object of the present invention is to speed up a driving speed of a selection line such as a word line or a bit line in a semiconductor device.

A further object of the present invention is to increase the occupied region per word line of a word line selection decoder or the occupied region per bit line of a bit line selection decoder without increasing the load capacitance of the word line or bit line in a semiconductor memory device.

Still another object of the present invention is to provide a semiconductor memory device in which a word line selection decoder or a bit line selection decoder has a large driving capability.

A still further object of the present invention is to provide a method of decoding a semiconductor memory device having an increased integration and capacity and capable of operating at high speed.

In order to achieve the above described objects, the semiconductor memory device in accordance with the present invention comprises a memory array, first selecting circuit, second selecting circuit, third selecting circuit and fourth selecting circuit. The memory array comprises a plurality of first selection lines, a plurality of second selection lines arranged so as to intersect with the plurality of first selection lines and a plurality of memory cells provided at intersections between the plurality of first selection lines and second selection lines. The memory array is divided into first and second memory array blocks by dividing the plurality of first selection lines.

The first selecting circuit is provided between the first and second memory array blocks and coupled to every other selection line of the plurality of first selection lines in the first memory array block. The second selecting circuit is provided opposite to the first selecting circuit about the first memory array block and coupled to the remaining selection lines of the plurality of first selection lines in the first memory array block. The third selecting circuit is provided between the first and second memory array blocks and coupled to every other selection line of the plurality of first selection lines in the second memory array block. The fourth selecting circuit is provided opposite to the third selecting circuit about the second memory array block and coupled to the remaining selection lines of the plurality of first selection lines of the second memory array block.

According to the semiconductor memory device in accordance with the present invention, since the first and second selecting circuit are arranged respectively at opposite sides of the first memory array block and the plurality of selection lines in the first memory array block are alternately coupled to the first selecting circuit and the second selecting circuit, the effective width of the pattern of the selecting means per selection line becomes twice that of the conventional semiconductor memory device. Similarly, since respective third and fourth selecting means are arranged on either side of the second memory array block, respectively and the plurality of selection lines in the second memory array block are alternately coupled to the third and fourth selecting means, the effective width of the pattern of the selecting means per selection line becomes twice that of the conventional semiconductor memory device.

Therefore, it is possible to constitute a circuit having a large driving capability in each selecting means.

In addition, since the memory array is divided into the first and second memory array blocks and selection lines extends only along the distance corresponding to each block, the length of each selection line is reduced. Therefore, the load capacitance of each selection line does not increase.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description is made of embodiments of the present invention using figures hereinafter.

Figure 1:
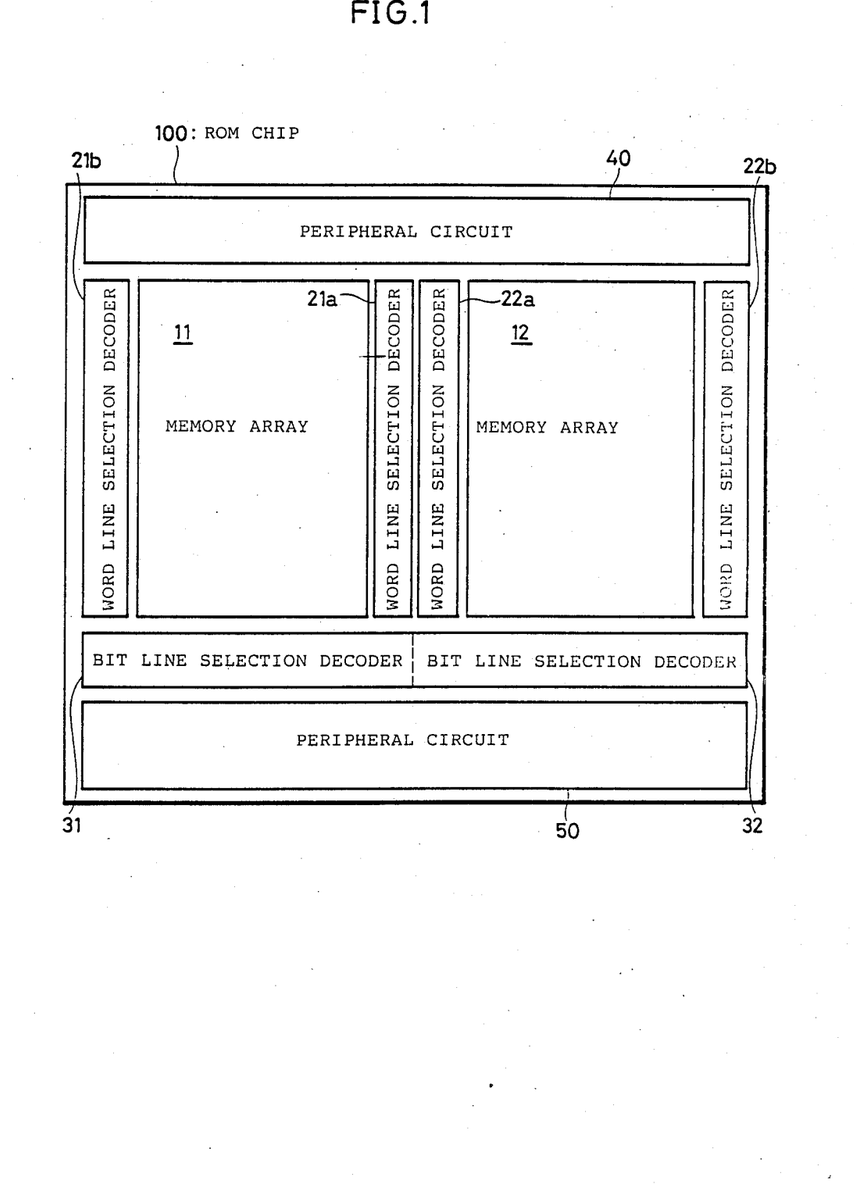
FIG. 1 is a plan block diagram of a ROM chip in accordance with one embodiment of the present invention.

FIG. 1 is a plan block diagram of a ROM chip in accordance with one embodiment of the present invention.

Referring to FIG. 1, a memory array is arranged in the center portion of a ROM chip 100. The memory array is divided into two memory array blocks (referred to as memory arrays hereinafter) 11 and 12. Word line selection decoders 21a and 22a are arranged between the memory arrays 11 and 12 so as to be along the sides of the memory arrays 11 and 12, respectively. In addition, a word line selection decoder 21b is arranged so as to be along the opposite side of the memory array 11 and the word line selection decoder 22b is arranged so as to be along the opposite side of the memory array 12. More specifically, the word line selection decoders 21a and 21b are arranged respectively on opposite sides of the memory array 11 and the word line selection decoders 22a and 22b are arranged respectively on opposite sides of the memory array 12. A bit line selection decoder 31 is arranged so as to be along one side of the other opposite sides of the memory array 11 and a bit line selection decoder 32 is arranged so as to be along one side of the other opposite sides of the memory array 12. A peripheral circuit 50 comprising a sense amplifier and the like is arranged outside the bit line selection decoders 31 and 32. A peripheral circuit 40 comprising an address buffer and the like is arranged on the opposite side of the bit line selection decoders 31 and 32 about the memory arrays 11 and 12.

Figure 2:
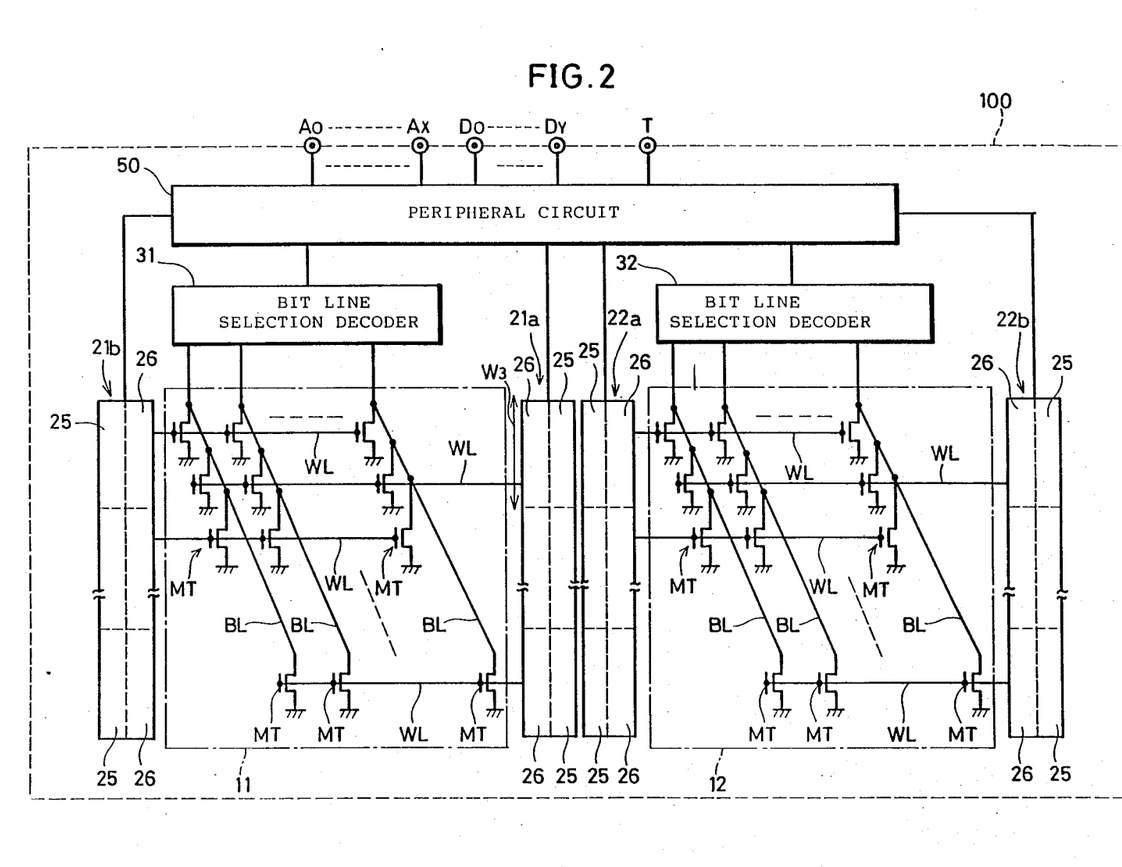
FIG. 2 is a circuit diagram of the main portion of the ROM device in FIG. 1.

FIG. 2 is a circuit diagram of the main portion of the ROM device in FIG. 1.

Referring to FIG. 2, similar to the memory arrays 1a and 1b shown in FIG. 12, memory arrays 11 and 12 comprise a plurality of word lines WL and a plurality of bit lines BL intersecting therewith. A memory cell comprising a memory transistor MT is connected to each intersection between the word lines WL and the bit lines BL.

A word line selection decoder 21a comprises a plurality of decoder circuits 25 and driver circuits 26 corresponding to alternate word lines WL of the plurality of word lines WL in the memory array 11. A word line selection decoder 21b comprises a plurality of decoder circuits 25 and driver circuits 26 corresponding to the remaining word lines WL in the memory array 11. Each decoder circuit 25 is connected to the corresponding word line WL through the driver circuit 26.

Similarly, a word line selection decoder 22a comprises a plurality of decoder circuits 25 and driver circuits 26 corresponding to alternate word line WL of the plurality of word lines WL in the memory array 12. A word line selection decoder 22b comprises a plurality of decoder circuits 25 and driver circuits 26 corresponding to the remaining word lines WL in the memory array 12. Each decoder circuit 25 is connected to the corresponding word lien WL through the driver circuit 26.

The plurality of bit lines BL in the memory arrays 11 and 12 are connected to the bit line selection decoders 31 and 32, respectively. The bit line selection decoders 31 and 32 are connected to a peripheral circuit 50 comprising a sense amplifier (for example, referring to 1984 IEEE International Solid-State Circuits Conference, DIGEST OF TECHNICAL PAPERS, pp 140–141) and the like.

Similar to the conventional ROM device, a threshold voltage $V_{TH}$ of each memory transistor MT is set at, for example 1.0 V or 8.0 V, corresponding to memory information "0" or "0".

A description is made of reading operation of the ROM in FIG. 2.

Address signals AO to AX are applied to the word line selection decoders 21a, 21b, 22a and 22b and bit line selection decoders 31 and 32 through the peripheral circuit 50 comprising the address buffer and the like. Data DO to DY and a timing signal T are applied to the peripheral circuit 50. In response to the address signals AO to AX, either one of the word line selection decoders 21a, 21b, 22a and 22b selects a word line WL in the memory array 11 or 12 and the potential of the word line WL is raised to the "H" level. When the potential of the word line WL is at the "H" level, the memory transistor MT becomes on or off depending on its programmed threshold voltage $V_{TH}$. The bit line selection decoders 31 and 32 select the bit lines BL in the memory arrays 11 and 12 in response to the address signal, respectively. The bit lines BL selected by the bit line selection decoders 31 and 32 are connected to the peripheral circuit 50 comprising the sense amplifier and the like. As a result, the selected drain potential of the memory transistor MT is transmitted to the sense amplifier in the peripheral circuit 50 and memory information "1" or "0" is read.

In this embodiment, since the plurality of word lines WL in the memory array 11 are alternately connected to the word line selection decoders 21a and 21b arranged respectively on opposite sides of the memory array 11, the width W3 of a pattern occupied region per work line of the word line selection decoders 21a and 21b becomes twice as large that of the conventional semiconductor memory device. Similarly, since the plurality of work lines WL in the memory array 12 are alternately connected to the word line selection decorders 22a and 22b respectively on opposite sides of the memory array 12, the width of the pattern occupied region per work line of the work line selection decoders 22a and 22b becomes twice as large. More specifically, each decoder circuit 25 and driver circuit 26 can be formed in the region having a double widths of the word line pitch.

Figure 3:
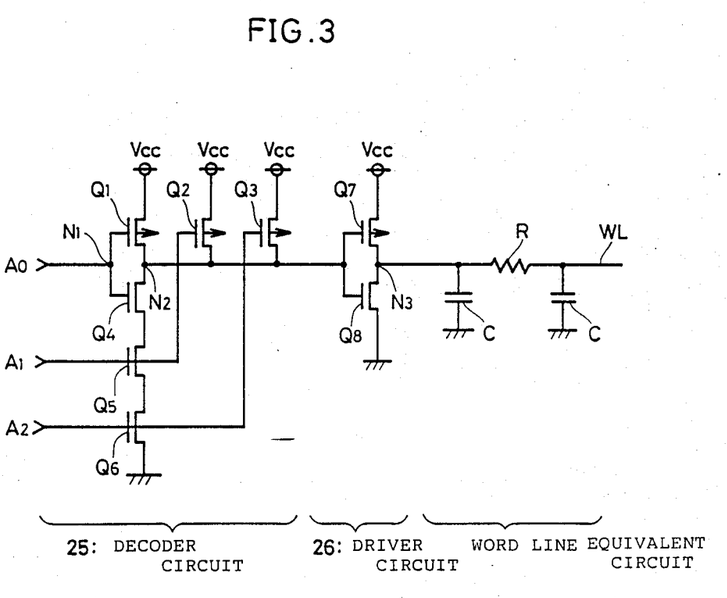
FIG. 3 is a circuit diagram showing structures of a decoder circuit and a driver circuit in a word line selection decoder.

FIG. 3 is a diagram showing one example of a circuit structure of the decoder circuit 25 and driver circuit 26 in the word line selection decoders 21a, 21b, 22a and 22b in FIG 2. A description is made of a case in which each of word line selection decoders 21a, 21b, 22a and 22b comprises eight pairs of decoder circuit 25 and driver circuit 26 for simplicity.

Referring to FIG. 3, the decoder circuit 25 comprises three P channel MOS transistors Q1 to Q3 and three N channel MOS transistor Q4 to Q6. The driver circuit 26 comprises a P channel MOS transistor Q7 and a N channel MOS transistor Q8.

The transistors Q1 and Q4 to Q6 are coupled between the power supply $V_{cc}$ and the ground in series. The transistors Q1 and Q4 have their gates connected to a node N1. The connection point between the transistors Q1 and Q4 is connected to a node N2. The transistors Q2 and W3 are coupled between the power supply $V_{cc}$ and the node N2. An address signal A0 is applied to the node N1, an address signal A1 is applied to the gates of the transistors Q2 and Q5 and an address signal A2 to the gates of the transistors Q3 and Q6. When the address signals A0, A1 and A2 are all at the "H" level, the potential of the node N2 attains the "L" level, and when either of address signal A0, A1 or A2 is at the "L" level, the potential of the node N2 attains the "H" level.

The transistor Q7 in the driver circuit 26 is connected between the power supply $V_{cc}$ and the node N3 and the transistor Q8 is connected between the node N3 and the ground. The gates of the transistors Q7 and Q8 are connected to the node N2 in the decoder circuit 25. When the potential of the node N2 is at the "L" level, the potential of the node N3 attains the "H" level, and when the potential of the node N2 is at the "L" level, the potential of the node N3 attains "L" level.

The structure of another decoder circuit 25 and driver circuit 26 is completely the same as that show in FIG. 3. However, in this example, the node N2 attains the "H" level is all address signals A0, A1 and A2 are added at the "H" level. Other decoder circuits 25 and driver circuits 26 that are responsive to different combinations of address signals can be provided in the same manner. Accordingly, seven combinations of addresses signals applied to the decode circuit 25 are as follows; (A2, A1, $\overline{A0}$), (A2, $\overline{A1}$, A0) (A2, $\overline{A1}$, $\overline{A0}$), ($\overline{A2}$, A1, A0), ($\overline{A2}$, A1, $\overline{A0}$), ($\overline{A2}$, $\overline{A1}$, A0), and ($\overline{A2}$, A1, $\overline{A0}$).

The word line WL is connected to the node N3. The word line WL has capacitance C and resistance R equivalently as shown in FIG. 3. Time constant in the response (rise) of the potential of the word line WL is represented by t=RC. Since the resistance of the driving transistor Q7 in the driver circuit 26 is considerably small as compared with the resistance R of the word line WL, it is generally possible to ignore it.

Figure 4:
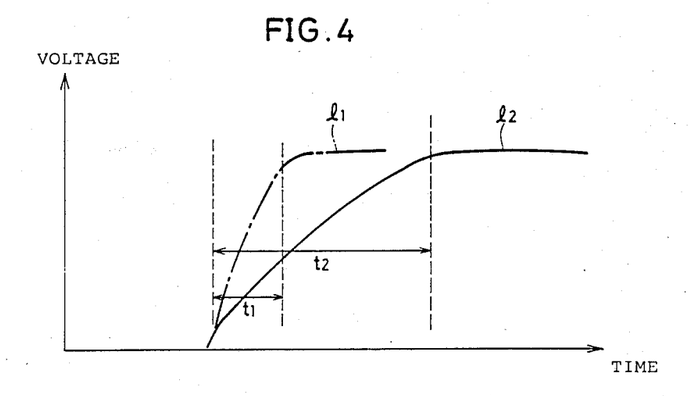
FIG. 4 is a graphic representation showing a response of a word line potential.

FIG. 4 is a graph showing the rise of the potential of the word line WL. As shown in FIG. 4, it is necessary to improve the load driving capability of the driver circuit 26 in order to move the curve l2 of the rise of the potential of the word line WL to the curve l1 and shorted the t2 of the rising time to t1. A minimum driving current $I_{MAX}$ of the transistors Q7 and Q8 is to be increased to improve the load driving capability of the driver circuit 26. The maximum driving current $I_{MAX}$ of the transistor is represented as follows:

$$I_{MAX} = \frac{1}{2} \times \frac{W \mu_0 C_0}{L} \times (V_G - V_{TH})^2$$

where L is a channel length, W is a channel width, $\mu_O$ is the mobility of electron, $C_O$ is gate capacitance, $V_G$ is a gate voltage and $V_{TH}$ is a threshold voltage. In addition, the maximum driving current $I_{MAX}$ is in inverse proportion to the time constant RC.

Since occupied-area of decoder circuit 25 and the driver circuit 26 is doubled, there are following advantages.

(1) It becomes possible to increase the channel widths W of the transistors Q7 and Q8, whereby the maximum driving current $I_{MAX}$ of the transistors Q7 and Q7 is increased and the time constant RC is decreased.

Figure 5:
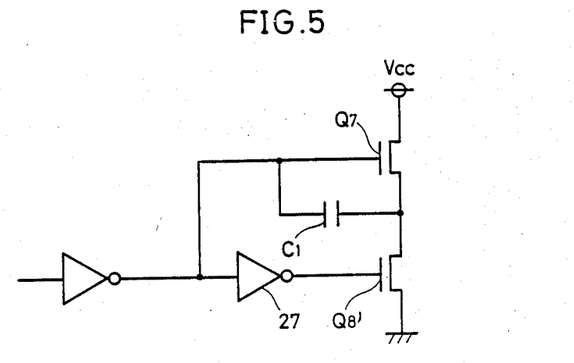
FIG. 5 is diagram of one example of a bootstrap circuit.

(2) It is possible to constitute a circuit which increases the gate voltage $V_G$. For example, as shown in FIG. 5, it is possible to constitute a bootstrap circuit comprising N channel MOS transistors Q7, and Q8, capacitance C1 and an inverter 27. This bootstrap circuit raises the gate voltage of the transistor Q7, above the power supply potential $V_{CC}$ by the capacitive coupling of the capacitance C1. In addition, it is possible to constitute a boost circuit. As a result, the maximum driving current $I_{MAX}$ of the transistor of the driver circuit is increased and the time constant RC is decreased.

(3) It becomes easy to constitute a precharge circuit (referring to, for example, 1984 IEEE International Solid-State Circuits Conference, DIGEST OF TECHNICAL PAPERS, PP. 138-139) precharging all word lines at the supply potential $V_{CC}$ by applying a pulse before driving of the word line, whereby the response speed of the word line potential is increased.

Since it is possible to constitute in this way the driver circuit having sufficiently large driving capability, the response time of the word line potential is made fast and operation of the whole ROM device is speeded up. In addition, it is not necessary to use a very minute pattern to constitute such a driver circuit.

Figure 6:
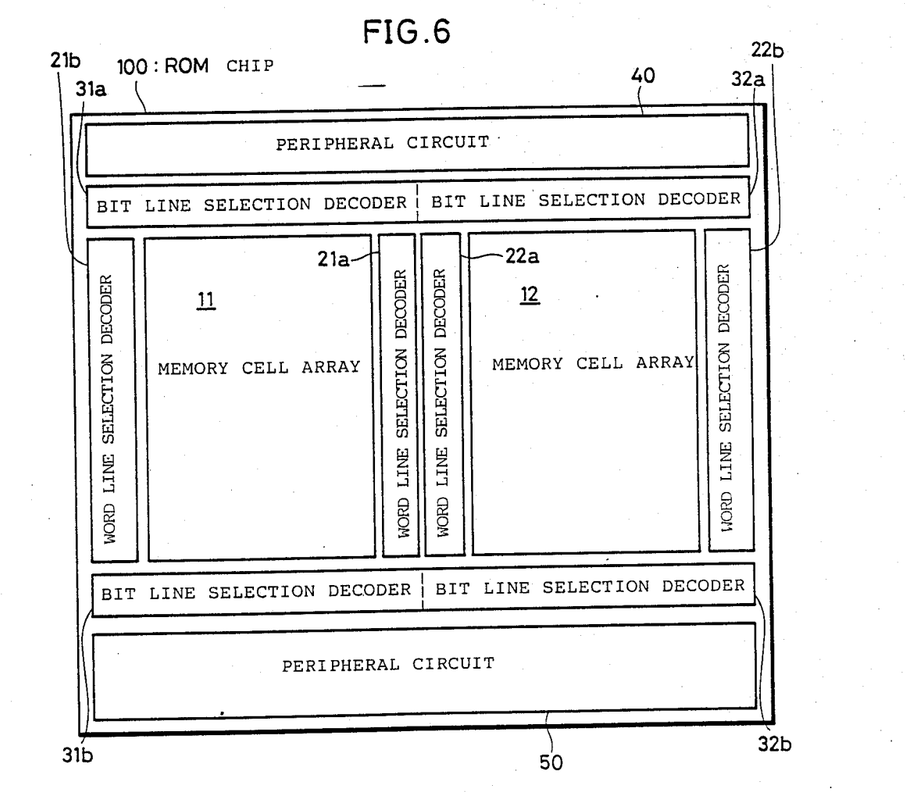
FIG. 6 is a plan block diagram of a ROM chip in accordance with another embodiment of the present invention.
Figure 7:
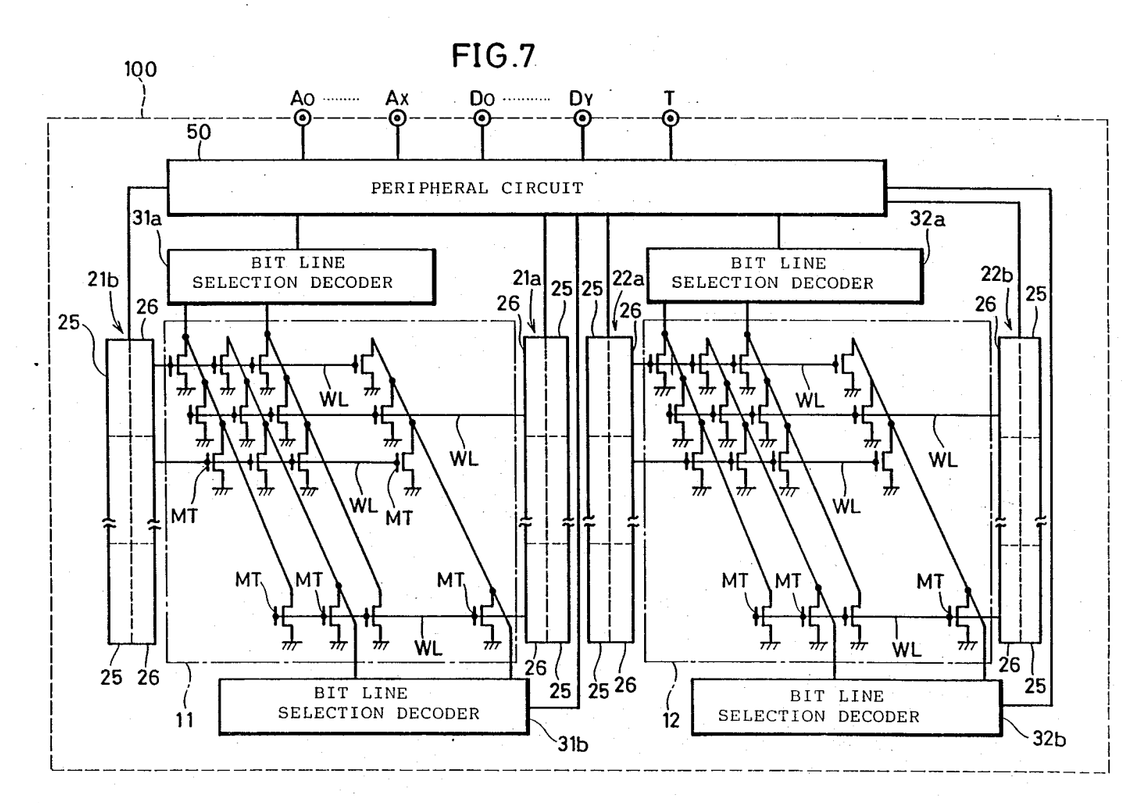
FIG. 7 is a circuit diagram of the main portion of the ROM device in FIG. 6.

FIG. 6 is a plan block diagram of a ROM chip in accordance with another embodiment of the present invention and FIG. 7 is a circuit diagram of the main portion of the ROM device in FIG. 6.

Word line selection decoders 21a and 21b are arranged on opposite sides of the memory array 11, respectively and bit line selection decoders 31a and 31b are arranged on the other opposite sides, respectively. Similarly, word line selection decoders 22a and 22b are arranged on opposite sides of the memory array 12, respectively and bit line selection decoders 32a and 32b are arranged on the other opposite sides, respectively. As shown in FIG. 7, a plurality of the bit lines BL in the memory array 11 are alternately connected to the bit line selection decoders 31a and 31b. A plurality of bit lines BL in the memory array 12 are alternately connected to the bit line selection decoders 32a and 32b.

As a result, the width of the pattern occupied region of the bit line selection decoder per bit line BL becomes twice. Therefore, it becomes easy to constitute a circuit having a large driving capability with 1 bit line selection decoder.

Figure 8:
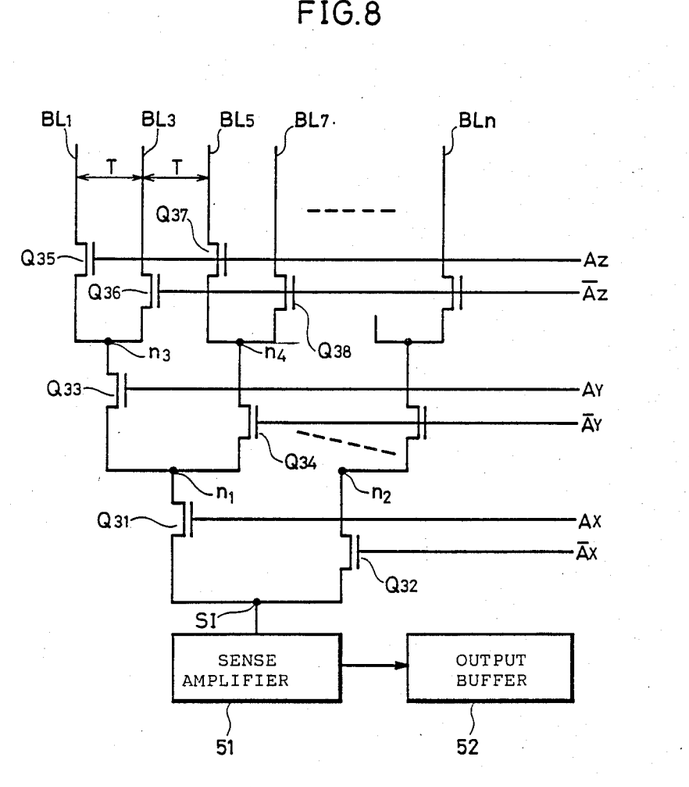
FIG. 8 is a diagram of one example of a circuit structure of a bit line selection decoder.

FIG. 8 is a diagram of one example of a circuit structure of the bit line decoder selection decoder.

The bit line selection decoder shown in FIG. 8 comprises a plurality of transfer gate transistors (simply referred to as transistors hereinafter) comprising N channel MOS transistors. The input terminal SI of a sense amplifier 51 is connected to a node n1 through a transistor Q31 and connected to a node n2 through a transistor Q32. The node n1 is connected to a node n3 through a transistor Q33 and connected to a node n4 through a transistor Q34. The node n3 is connected to the bit line BL 1 through a transistor Q35 and connected to the bit line BL3 through a transistor Q36. On the other hand, the node n4 is connected to a bit line BL5 through a transistor Q37 and connected to a bit line BL7 through a transistor Q38.

Address signal AX and its inverted signal $\overline{A}_X$/ are applied to the gates of the transistors Q31 and Q32, respectively. An address signal $A_Y$ and its inverted signal $\overline{A}_Y$/ are applied to the gates of the transistors Q33 and Q34, respectively. An address signal $A_Z$ and its inverted signal $\overline{AD}$ Z/ are applied to the gates of the transistors Q35 and Q36 and gates of the transistors Q37 and Q38, respectively.

For example, when the address signals $A_X$, $A_Y$ and $A_Z$ are all at "H" level, the transistors Q31, Q33 and Q35 turn on and the bit line BL1 is connected to the sense amplifier 51.

Since a width of T of the pattern occupied region per bit line of each bit line selection decoder becomes wide in case of the embodiment shown in FIGS. 6 and 7, it is possible to constitute the transistors Q31 to 38 from transistors having large driving capability.

Figure 9:
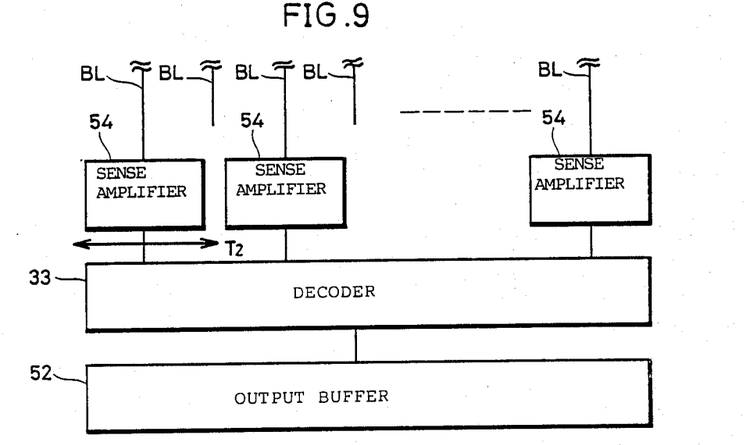
FIG. 9 is a block diagram showing another structure example of a sense amplifier and a decoder.

In general, a circuit for driving the bit line BL and a circuit for reading memory information "1" or "0" in response to the change of its driving current or driving voltage are constituted in an integral manner in the sense amplifier 51. Therefore, the driving speed of the bit line BL changes depending on the load of the bit line BL. As means for enhancing the driving capability by reducing the load of the bit line BL as much as possible, a sense amplifier 54 may be provided at every other bit line BL and a decoder 33, that is, a transfer gate transistor may be provided between the sense amplifiers 54 and the output buffer 52 as shown in FIG. 9. As a result, detecting sensitivity by the sense amplifier 54 can be improved.

In this case, the pattern occupied area T2 of its sense amplifier 54 becomes large by providing sense amplifiers 54 and decoders 33 respectively on opposite sides of the plurality of bit lines BL and alternately connecting the plurality of bit lines BL to the sense amplifiers 54 respectively on opposite sides. Therefore, it is possible to constitute the sense amplifier 54 having large driving capability.

Figure 10:
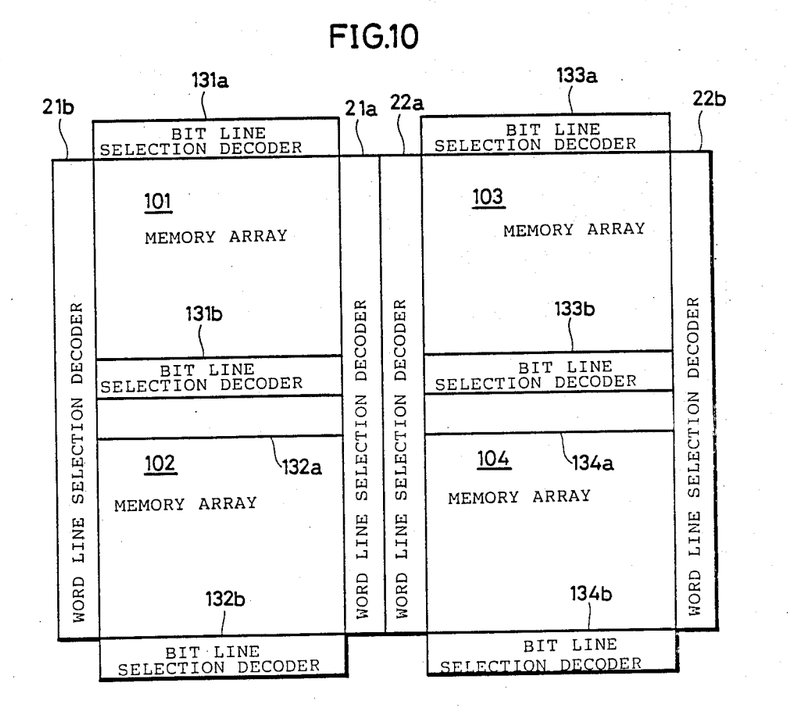
FIG. 10 is a plan block diagram of a ROM chip in accordance with a further embodiment of the present invention.

FIG. 10 is a plan block diagram of a ROM chip in accordance with still another embodiment of the present invention.

In this embodiment, the memory array 11 shown in FIGS. 6 and 7 are still divided into two memory arrays 101 and 102 and the memory array 12 is still divided into the memory array so 1-3 and 104. Bit line selection decoders 131a, 131b, 132a and 132b are arranged so as to be along the opposite sides of memory arrays 101 and 102, respectively. Bit line selection decoders 133a, 133b, 134a and 134b are arranged so as to be along to the opposite sides of memory arrays 103 and 104, respectively. In this case, the length of each bit line and also the load capacitance of each bit line become half, so that the operation speed of the bit line selection decoder increasingly speeds up.

Although a description was made of a case in which the present invention was applied to the ROM device in the above described embodiment, the present invention can be also applied to a RAM device and other semiconductor memory devices.

Since the width of the pattern occupied region of selecting means per selection line can be made twice as long as a conventional semiconductor memory device without increasing the load capacitance of each selection line in accordance with the present invention, selecting means having large driving capability can be easily constituted. As a result, there can be provided a semiconductor memory device capable operating at high speed and having a high degree of integration and large capacity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of first selection lines;
   a plurality of second selection lines arranges so as to intersect said plurality of first selection lines;
   a memory array comprising a plurality of memory cells provided at intersections between said plurality of first selection lines and said plurality of second selection lines;
   means for receiving an address signal for selecting a memory cell in said memory array;
   said memory array divided into first and second memory array blocks by dividing said plurality of first selection lines;
   first selecting means provided between said first and second memory array blocks and connected only to every other selection line of said plurality of first selection lines in said first memory array block;
   second selecting means provided on the opposite side of said first selecting means about said first memory array block and connected to only the remaining selection lines of said plurality of first selection lines in said first memory array block;
   third selecting means provided between said first and second memory array blocks and connected only to every other selection line of said plurality of first selection lines in said second memory array block; and
   fourth selecting means provided on the opposite side of said third selecting means about said second memory array block and connected only to the remaining selection lines of said plurality of first selection lines in said second memory array block;
   means for supplying said address signal to said first through fourth selecting means.

2. A semiconductor memory device in accordance with claim 1, wherein each of said plurality of first selection lines comprises a word line and said first, second, third and fourth selection means comprise word line selecting means.

3. A semiconductor memory device in accordance with claim 2, wherein each of said word line selection means comprises a word line selection decoder comprising:
   a plurality of decoder circuits each selecting the corresponding word line in response to a predetermined address signal; and
   a plurality of driver circuits each driving a word line selected by each of said plurality of decoder circuits.

4. A semiconductor memory device in accordance with claim 1, wherein each of said plurality of first selection lines comprises a bit line;
   and each of said first, second, third and fourth selecting means comprises bit line selecting means.

5. A semiconductor memory device in accordance with claim 4 further comprising at least one sense amplifier, wherein each of said bit line selecting means comprises a bit line selection decoder comprising a plurality of transfer gate transistors, and wherein a selected bit line is coupled to said sense amplifier through selected ones of said plurality of transfer gate transistors which are activated in response to an address signal.

6. A semiconductor memory device in accordance with claim 4, wherein said bit line selecting means comprises:
   a plurality of sense amplifiers each connected to a corresponding bit line; and
   a decoder for selecting one of said plurality of sense amplifiers in response to an address signal.

7. A semiconductor memory device in accordance with claim 1 further comprising:
   fifth and sixth selecting means provided on either side of said plurality of second selection lines in said first memory array block and connected to only every other selection line of said plurality of second selection lines and connected only to the remaining selection lines of said plurality of second selection lines, respectively; and
   seventh and eighth selecting means provided on either side of said second selection lines of said second memory array block and connected to only every other selection line of said plurality of second lines and connected only to the remaining selection lines of said plurality of second election lines, respectively.

8. A semiconductor memory device in accordance with claim 7, wherein each of said plurality of first selection lines comprises a word line and each of said first, second, third and fourth selecting means comprises word line selecting means; and each of said plurality of second selection lines comprises a bit line and each of said fifth, sixth, seventh and eighth selecting means comprises bit line selecting means.

9. A semiconductor memory device comprising:

a plurality of first selection lines;

a plurality of second selection lines arranged so as to intersect said plurality of first selection lines;

a memory array comprising a plurality of memory cells provided at intersections between said plurality of first selection lines and said plurality of second selection lines;

said memory array divided into first and second memory array blocks by dividing said plurality of first selection lines;

first selecting means provided between said first and second memory array blocks and connected only to every other selection line of said plurality of first selection lines in said first memory array block;

second selecting means provided on the opposite side of said first selecting means about said first memory array block and connected only to the remaining selection lines of said plurality of first selection lines in said first memory array block;

third selecting means provided between said first and second memory array blocks and connected only to every other selection line of said plurality of first selection lines in said second memory array block; and fourth selecting means provided on the opposite side of said third selecting means about said second memory array block and connected only to the remaining selection lines of said plurality of said first selection lines in said second memory array block;

each of said first and second memory array blocks is divided into first and second subblocks by dividing said plurality of second selection lines;

fifth selecting means provided between said first and second subblocks and connected only to every other selection line of said plurality of second selection lines in said first subblocks;

sixth selecting means provided on the opposite side of said fifth selecting means about said first subblocks and connected only to the remaining selection lines of said plurality of second selection lines in said first subblocks;

seventh selecting means provided between said first and second subblocks and connected only to every other selection line of said plurality of second selection lines in said second subblock; and eighth selecting means provided on the opposite side of said seventh selecting means about said second subblocks and connected only to the remaining selection lines of said plurality of second selection lines of in said second subblocks.

10. A semiconductor memory device in accordance with claim 9, wherein each of said plurality of first selection lines comprises a word line and each of said first, second, third and fourth selecting means comprises word line selecting means; and each of said plurality of second selection lines comprises a bit line and each of said fifth, sixth, seventh and eight selecting means comprises bit line selecting means.

11. A method of decoding a semiconductor memory device, wherein said device comprises:

a plurality of first selection lines;

a plurality of second selection lines arranges so as to intersect said plurality of first selection lines;

a memory array comprising a plurality of memory cells provided at intersections between said plurality of first and second selection lines;

said memory array divided into first and second memory array blocks by dividing said plurality of first selection lines;

first selection means provided between said first and second memory array blocks;

second selecting means provided on the opposite side of said first selecting means about said first memory array block;

third selecting means provided between said first and second memory array blocks; and fourth selecting means provided on the opposite side of said third selecting means about said second memory array block, said method comprising the steps of:

detecting an input address signal, and in response, (a) controlling said first selecting means to select from only alternate lines of said plurality of first selection lines in said first memory array block;

(b) controlling said second selecting means to select from only the remaining lines of said plurality of first selection lines in said first memory array block;

(c) controlling said third selecting means to select from only alternate lines of said plurality of first selection lines in said second memory array block; and (d) controlling said fourth selecting means to select from only the remaining lines of said plurality of first selection lines in said second memory array block.

12. A semiconductor memory device comprising:

a plurality of first selection lines;

a plurality of second selection lines arranged so as to intersect said plurality of first selection lines;

a memory array comprising a plurality of memory cells provided at inter sections between said plurality of first selection lines and said plurality of second selection lines;

means for receiving an address signal for selecting a memory cell in said memory array;

said memory array divided into first and second memory array blocks by dividing said plurality of first selection lines;

first selecting means provided between said first and second memory array blocks and connected to at least one but not all of said plurality of first selection lines in said first memory array block;

second selecting means provided on the opposite side of said first selecting means about said first memory array block and connected to only the remaining selection lines of said plurality of first selection lines in said first memory array block;

third selecting means provided between said first and second memory array blocks and connected to at least one but not all of said plurality of first selection lines in said second memory array block; and fourth selecting means provided on the opposite side of said third selecting means about said second memory array block and connected to only the remaining selection lines of said plurality of first selection lines in said second memory array block;

means for supplying said address signal to said first through fourth selecting means.

13. A semiconductor memory device comprising:
a plurality of first selection lines;
a plurality of second selection lines arranges so as to intersect said plurality of first selection lines;
a memory array comprising a plurality of memory cells provided at intersections between said plurality of first selection lines and said plurality of second selection lines;
said memory array divided into first and second memory array blocks by dividing said plurality of first selection lines;
first selecting means provided between said first and second memory array blocks and coupled to first selection lines in said first memory array block;
second selecting means provided on the opposite side of said first selecting means about said first memory array block and coupled to first selection lines in said first memory array block;
third selecting means provided between said first and second memory array blocks and coupled to first selection lines in said second memory array block; and
fourth selecting means provided on the opposite side of said third selecting means about said second memory array block and coupled to first selection lines in said second memory array block;
each of said first and second memory array blocks are each divided into first and second subblocks by dividing said plurality of second selection lines;
fifth selecting means provided between said first and second subblocks and coupled to second selection lines in said first subblocks;
sixth selecting means provided on the opposite side of said fifth selecting means about said first subblocks and coupled to second selection lines in said first subblocks;
seventh selecting means provided between said first and second subblocks and coupled to second selection lines in said second subblocks; and
eighth selecting means provided on the opposite side of said seventh selecting means about said second subblocks and coupled to second selection lines in said second subblocks.

* * * * *